United States Patent
Tseng et al.

(10) Patent No.: US 10,794,388 B2
(45) Date of Patent: Oct. 6, 2020

(54) FAN FAILURE BACKUP APPARATUS AND METHOD OF BACKING UP THE SAME

(71) Applicant: DELTA ELECTRONICS, INC., Taoyuan (TW)

(72) Inventors: Wei-Shuo Tseng, Taoyuan (TW); Chia-Feng Wu, Taoyuan (TW); Po-Hui Shen, Taoyuan (TW); Chia-Huang Wu, Taoyuan (TW); Chun-Chieh Tsai, Taoyuan (TW); Wen-Chih Wang, Taoyuan (TW)

(73) Assignee: Delta Electronics, Inc., Taoyuan (TW)

(*) Notice: Subject to any disclaimer, the term of this patent is extended or adjusted under 35 U.S.C. 154(b) by 24 days.

(21) Appl. No.: 16/199,710

(22) Filed: Nov. 26, 2018

(65) Prior Publication Data

US 2019/0219061 A1   Jul. 18, 2019

(30) Foreign Application Priority Data

Jan. 17, 2018   (CN) .......................... 2018 1 0042652

(51) Int. Cl.
- *F04D 27/00* (2006.01)
- *F04D 25/06* (2006.01)
- *H05K 7/20* (2006.01)

(52) U.S. Cl.
CPC .......... *F04D 27/004* (2013.01); *F04D 25/06* (2013.01); *F04D 27/008* (2013.01); *H05K 7/2019* (2013.01); *H05K 7/20209* (2013.01); *F05B 2270/1074* (2013.01); *F05B 2270/3013* (2013.01); *F05B 2270/327* (2013.01); *F05B 2270/502* (2013.01)

(58) Field of Classification Search
None
See application file for complete search history.

(56) References Cited

U.S. PATENT DOCUMENTS

| | | | | |
|---|---|---|---|---|
| 6,398,505 B1* | 6/2002 | Sekiguchi | ............. | F04D 25/166 361/695 |
| 6,954,684 B2* | 10/2005 | Frankel | ............. | G05D 23/1902 361/695 |
| 2004/0130868 A1* | 7/2004 | Schwartz | ................... | G06F 1/20 361/679.48 |
| 2005/0163615 A1* | 7/2005 | Chheda | ................... | H01L 23/34 416/31 |
| 2006/0202647 A1* | 9/2006 | Lin | ..................... | H05K 7/20209 318/66 |
| 2010/0226792 A1* | 9/2010 | Sato | ....................... | F04D 25/166 417/1 |
| 2016/0116180 A1* | 4/2016 | Hu | .......................... | G05B 15/02 700/276 |
| 2016/0183406 A1* | 6/2016 | Ragupathi | .......... | H05K 7/20209 700/282 |

* cited by examiner

*Primary Examiner* — Bickey Dhakal
(74) *Attorney, Agent, or Firm* — Muncy, Geissler, Olds & Lowe, P.C.

(57) ABSTRACT

A fan failure backup apparatus includes a first fan module and a second fan module. When a second control unit of the second fan module realizes that the first fan module is failed through a first control unit of the first fan module, and the second control unit realizes that the second fan module is not failed, the second control unit controls the second fan module to additionally enhance a pressure-flow characteristic of a second fan unit of the second fan module.

13 Claims, 6 Drawing Sheets

FAN FAILURE BACKUP APPARATUS AND METHOD OF BACKING UP THE SAME

BACKGROUND

Technical Field

The present disclosure relates to a fan failure backup apparatus and a method of backing up the same, and more particularly to a fan failure backup apparatus, and a method of backing up the same by using a pressure-flow characteristic.

Description of Related Art

The statements in this section merely provide background information related to the present disclosure and do not necessarily constitute related art.

In general, electronic devices generally includes a variety of circuit boards with different functions and electronic components. Since the production of integrated circuits is increasingly precise and complex, the electricity consumption of the electronic devices is also relatively increased. When the electronic device is in operation, the internal electronic components of the electronic device generate heat so that the temperature inside the electronic device increases. When the temperature inside the electronic device exceeds an upper limit temperature of the electronic device operating in the normal condition, it may cause the electronic device to malfunction. Therefore, fan devices are equipped with the electronic device to dissipate the heat generated inside the electronic device when the electronic device is in operation.

Due to the long-term operation of the fan device, the aging electronic device may fail to well dissipate the heat generated inside thereof. Therefore, a fan failure backup apparatus is cooperated with the electronic device to overcome the problem of the poor heat dissipation for the aging electronic device. However, the currently used multiple fan devices are controlled and monitored by a single control unit, so that once the single control unit is failed, the fan failure backup apparatus is almost failed.

SUMMARY

In order to solve the problem above, a fan failure backup apparatus is provided. The fan failure backup apparatus includes a first fan module and a second fan module. The first fan module includes a first fan unit and a first control unit. The second fan module includes a second fan unit and a second control unit. The first control unit is coupled to the first fan unit, and the second control unit is coupled to the second fan unit and the first control unit. A series axial-flow fan includes the first and second fan modules. When the second control unit realizes that the first fan module is failed through the first control unit and realizes that the second fan module is not failed, the second control unit controls the second fan module to additionally enhance a pressure-flow characteristic of the second fan unit.

In one or more than one embodiment, the pressure-flow characteristic of the second fan unit is enhanced to (100+n) %, in which n is less than or equal to 99.

In one or more than one embodiment, the first fan unit has a first pressure-flow characteristic curve, and the second fan unit has a second pressure-flow characteristic curve; the second control unit enhances the pressure-flow characteristic from the second pressure-flow characteristic curve to be greater than or equal to the first pressure-flow characteristic curve by increasing a rotation speed of the second fan unit.

In one or more than one embodiment, when the first fan module fails, the first control unit controls the first fan unit entering a braking mode.

In one or more than one embodiment, the first control unit outputs a first warning signal to the second control unit so that the second control unit realizes that the first fan module is failed.

In one or more than one embodiment, when the first fan module and the second fan module are failed, the second control unit receives the first warning signal and outputs a second warning signal to the first control unit; the first control unit controls the first fan unit entering a braking mode, and the second control unit controls the second fan unit entering the braking mode.

In one or more than one embodiment, the first fan module further includes a first drive unit coupled to the first control unit and the first fan unit. The second fan module further includes a second drive unit coupled to the second control unit and the second fan unit. The first control unit controls an upper-bridge switch assembly of the first drive unit being turned on or a lower-bridge switch assembly of the first drive unit being turned on to control the first fan unit entering the braking mode. The second control unit controls an upper-bridge switch assembly of the second drive unit being turned on or a lower-bridge switch assembly of the second drive unit being turned on to control the second fan unit entering the braking mode.

In one or more than one embodiment, the second control unit increases a duty cycle of the upper-bridge switch assembly of the second drive unit or a duty cycle of the lower-bridge switch assembly of the second drive unit to additionally enhance the pressure-flow characteristic of the second fan unit when the second control unit realizes that the first fan module is failed through the first control unit.

In one or more than one embodiment, the first fan module is a front fan, and the second fan module is a rear fan.

In order to solve the problem above, a method of backing up a fan failure backup apparatus is provided. The method includes steps of: (a) providing a first fan module and a second fan module; wherein a series axial-flow fan includes the first fan module and the second fan module, and a first control unit of the first fan module is coupled to a second control unit of the second fan module; (b) driving a first fan unit of the first fan module to rotate by the first control unit, and driving a second fan unit of the second fan module to rotate by the second control unit; (c) continuously detecting whether the first fan module fails by the second control unit, and continuously detecting whether the second fan module fails by the first control unit; and (d) controlling the second fan module to additionally enhance a pressure-flow characteristic of the second fan unit by the second control unit when the second control unit realizes that the first fan module is failed through the first control unit and realize that the second fan module is not failed.

In one or more than one embodiment, the step (d) further includes a step of: (d1) enhancing the pressure-flow characteristic of the second fan unit to (100+n) %, in which n is less than or equal to 99.

In one or more than one embodiment, the step (d) further includes a step of: (d2) providing a first pressure-flow characteristic curve of the first fan unit and providing a second pressure-flow characteristic curve of the second fan unit, and enhancing the pressure-flow characteristic from the second pressure-flow characteristic curve to be greater than or equal to the first pressure-flow characteristic curve by increasing a rotation speed of the second fan unit by the second control unit.

In one or more than one embodiment, the step (d) further includes a step of: (d3) controlling the first fan unit entering a braking mode by the first control unit when the first control unit realizes that the first fan module is failed.

In one or more than one embodiment, the method further includes a step of: (e) receiving a first warning signal outputted from the first control unit and outputting a second warning signal to the first control unit by the second control unit when the first fan module and the second fan module are failed; controlling the first fan unit entering a braking mode by the first control unit and controlling the second fan unit entering the braking mode by the second control unit.

In one or more than one embodiment, the step (e) further includes a step of: (e1) turning on an upper-bridge switch assembly or a lower-bridge switch assembly of a first drive unit of the first fan module to control the first fan unit entering the braking mode by the first control unit; turning on an upper-bridge switch assembly or a lower-bridge switch assembly of a second drive unit of the second fan module to control the second fan unit entering the braking mode by the second control unit.

In one or more than one embodiment, the step (d) further includes a step of: (d4) increasing a duty cycle of the upper-bridge switch assembly of the second drive unit or a duty cycle of the lower-bridge switch assembly of the second drive unit by the second control unit to additionally enhance the pressure-flow characteristic of the second fan unit.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
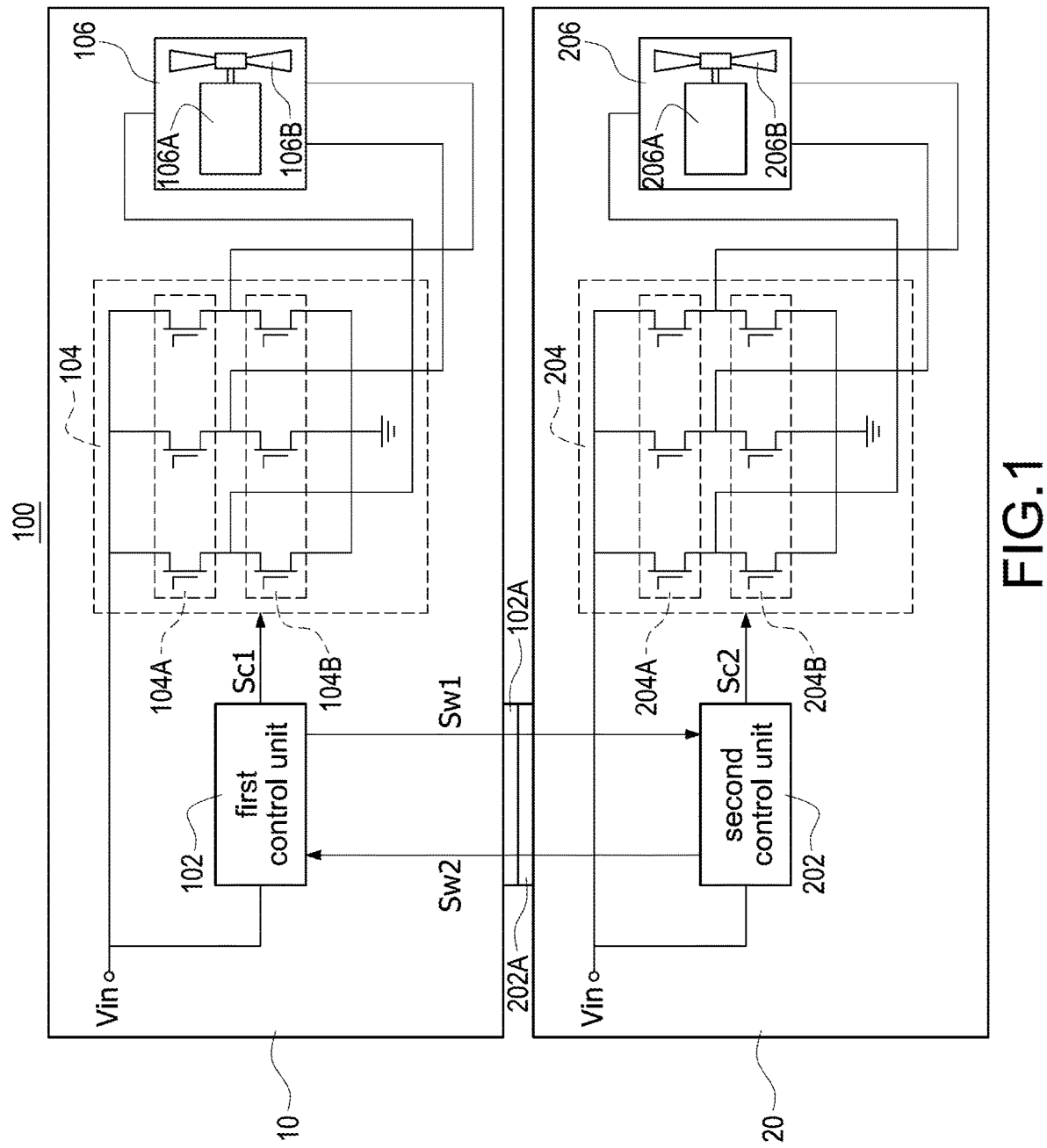
FIG. 1 is a circuit block diagram of a fan failure backup apparatus according to a first embodiment of the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a circuit block diagram of a fan failure backup apparatus according to a first embodiment of the present disclosure. The fan failure backup apparatus 100 includes a first fan module 10 and a second fan module 20 coupled to the first fan module 10. The first fan module 10 includes a first control unit 102, a first drive unit 104, and a first fan unit 106. The first drive unit 104 is coupled between the first control unit 102 and the first fan unit 106. The first control unit 102 and the first drive unit 104 receive an input power source Vin. The first control unit 102 outputs a first control signal Sc1 to the first drive unit 104 to make the first drive unit 104 drive the first fan unit 106 rotating. The first control unit 102 adjusts a rotation speed of the first fan unit 106 by controlling the first control signal Sc1.

The second fan module 20 includes a second control unit 202, a second drive unit 204, and a second fan unit 206. The second drive unit 204 is coupled between the second control unit 202 and the second fan unit 206. The second control unit 202 and the second drive unit 204 receive the input power source Vin. The second control unit 202 outputs a second control signal Sc2 to the second drive unit 204 to make the second drive unit 204 drive the second fan unit 206 rotating. The second control unit 202 adjusts a rotation speed of the second fan unit 206 by controlling the second control signal Sc2.

In one embodiment, a series axial-flow fan includes the first fan unit 106 and the second fan unit 206, and the first fan unit 106 is a front fan and the second fan unit 206 is a rear fan, but not limited. In other words, as long as a fan failure backup apparatus has two or more than two fan units, the backup method can be applied to the fan failure backup apparatus. In one embodiment, since the first control unit 102 is integrated inside the first fan module 10 and the second control unit 202 is integrated inside the second fan module 20, no additional control units or controllers need to be used to control the first fan module 10 and the second fan module 20 for failure backup so that the hardware architecture can be simplified.

In one embodiment, the first drive unit 104 includes an upper-bridge switch assembly 104A and a lower-bridge switch assembly 104B. The upper-bridge switch assembly 104A has a plurality of upper-bridge switches. Take a three-phase three-bridge topology for example, the upper-bridge switch assembly 104A has three upper-bridge switches and the lower-bridge switch assembly 104B has three lower-bridge switches. The upper-bridge switch assembly 104A is coupled to the lower-bridge switch assembly 104B, and the upper-bridge switch assembly 104A receives the input power source Vin. The first fan unit 106 includes a first motor 106A and a first fan blade 106B axially connected to the first motor 106A. The first motor 106A is coupled to the upper-bridge switch assembly 104A and the lower-bridge switch assembly 104B. The first control signal Sc1 has a plurality of switch control signals for correspondingly controlling the upper-bridge switches of the upper-bridge switch assembly 104A and the lower-bridge switches of the lower-bridge switch assembly 104B, thereby making the first motor 106A rotate to drive the first fan blade 106B. The first control unit 102 adjusts a duty cycle of each upper-bridge switch of the upper-bridge switch assembly 104A or a duty cycle of each lower-bridge switch of the lower-bridge switch assembly 104B by adjusting the first control signal Sc1, thereby adjusting the rotation speed of the first fan unit 106.

The second drive unit 204 includes an upper-bridge switch assembly 204A and a lower-bridge switch assembly 204B. The upper-bridge switch assembly 204A has a plurality of upper-bridge switches. Take a three-phase three-bridge topology for example, the upper-bridge switch assembly 204A has three upper-bridge switches and the lower-bridge switch assembly 204B has three lower-bridge switches. The upper-bridge switch assembly 204A is coupled to the lower-bridge switch assembly 204B, and the upper-bridge switch assembly 204A receives the input power source Vin. The second fan unit 206 includes a second motor 206A and a second fan blade 206B axially connected to the second motor 206A. The second motor 206A is coupled to the upper-bridge switch assembly 204A and the lower-bridge switch assembly 204B. The second control signal Sc2 has a plurality of switch control signals for correspondingly controlling the upper-bridge switches of the upper-bridge switch assembly 204A and the lower-bridge switches of the lower-bridge switch assembly 204B, thereby making the second motor 206A rotate to drive the second fan blade 206B. The second control unit 202 adjusts a duty cycle of each upper-bridge switch of the upper-bridge switch assembly 204A or a duty cycle of each lower-bridge switch of the lower-bridge switch assembly 204B by adjusting the second control signal Sc2, thereby adjusting the rotation speed of the second fan unit 206.

As shown in FIG. 1, the first control unit 102 has a first connecting terminal 102A and the second control unit 202 has a second connecting terminal 202A. By coupling between the first connecting terminal 102A and the second connecting terminal 202A, the first control unit 102 is communicated with the second control unit 202 to realize each other's operation state. More specifically, the first control unit 102 detects and realizes that the first fan unit 106 is in a normal operation, a failed stop state, or a braking mode, and the second control unit 202 detects and realizes that the second fan unit 206 is in a normal operation, a failed stop state, or a braking mode. Therefore, the first control unit 102 is communicated with the second control unit 202 to realize the operation states of the fan units controlled by the first control unit 102 and the second control unit 202 through the first connecting terminal 102A and the second connecting terminal 202A.

For example, when the rotation speed of the first fan unit 106 is abnormal or zero due to a failed operation, the first control unit 102 realizes that the first fan module 10 is failed through a feedback signal (not shown). At this condition, the first control unit 102 outputs a first warning signal Sw1 to the second control unit 202 so that the second control unit 202 realizes that the first fan module 10 is failed. When the rotation speed of the second fan unit 206 is abnormal or zero due to a failed operation, the second control unit 202 realizes that the second fan module 20 is failed through a feedback signal (not shown). At this condition, the second control unit 202 outputs a second warning signal Sw2 to the first control unit 102 so that the first control unit 102 realizes that the second fan module 20 is failed.

When the second control unit 202 receives the first warning signal Sw1 and the second control unit 202 confirms that the second warning signal Sw2 is not outputted therefrom by the self-detecting, it means that the second control unit 202 realizes that the first fan module 10 is failed and the second fan module 20 is not failed. At this condition, since only the rear fan, namely the second fan unit 206 normally operates, the second control unit 202 adjusts the second control signal Sc2 outputted to the second drive unit 204 to control the duty cycles of the upper-bridge switches of the upper-bridge switch assembly 204A or the duty cycles of the lower-bridge switches of the lower-bridge switch assembly 204B, thereby increasing the rotation speed of the second fan unit 206. Therefore, when the rotation speed of the second fan unit 206 is increased, the pressure-flow characteristic of the second fan unit 206 is enhanced to achieve the backup function under the failure of the first fan module 10.

The situation under the failure of the second fan module 20 is similar to that under the failure of the first fan module 10. However, the major difference is that the first control unit 102 adjusts the first control signal Sc1 outputted to the first drive unit 104 to control the duty cycles of the upper-bridge switches of the upper-bridge switch assembly 104A or the duty cycles of the lower-bridge switches of the lower-bridge switch assembly 104B, thereby increasing the rotation speed of the first fan unit 106. Therefore, when the rotation speed of the first fan unit 106 is increased, the pressure-flow characteristic of the first fan unit 106 is enhanced to achieve the backup function under the failure of the second fan module 20. In some embodiments, the backup method can be applied to the fan failure backup apparatus having more than two fan modules.

More specifically, the pressure-flow characteristic of the first fan unit 106 means that air flow volumes provided from the first fan blade 106B of the first fan unit 106 corresponding to different static pressures when the first fan unit 106 is in operation, and the pressure-flow characteristic of the second fan unit 206 is similar. For the same fan unit, the different air flow volumes are based on different static pressures. The higher is the static pressure, the larger is the resistance, and vice versa. When the static pressure is lower, namely the resistance is lower, the air flow volume provided from the fan unit is larger. However, the air flow volume is smaller once the static pressure is higher, namely the resistance is higher. When the first fan module 10 is failed, the second control unit 202 controls the pressure-flow characteristic of the second fan unit 206 to enhanced to (100+n) % so that the second fan unit 206 is used to additionally compensate the reduced pressure-flow characteristic of the first fan module 10. The significant increased rotation speed of the fan unit of the fan module which is not failed would not damage the corresponding drive unit due to the generated large current since the pressure-flow characteristic is limited to enhance to (100+n) %, and n is less than or equal to 99.

In particular, not only the rotation speed of the second fan unit 206 is increased to additionally compensate the reduced pressure-flow characteristic of the first fan module 10 under the failure of the first fan module 10. The relationship between the pressure-flow characteristic of the first fan unit 106 and that of the second fan unit 206, and a method of operating of backing up the fan failure backup apparatus 100 will be further described below.

Please refer to FIG. 1 again, when the second control unit 202 receives the first warning signal Sw1 outputted from the first control unit 102 and the second control unit 202 also outputs the second warning signal Sw2 to the first control unit 102, it means that the first fan module 10 and the second fan module 20 are both failed. At the condition, the first control unit 102 outputs the first control signal Sc1 to control the first fan unit 106 entering a braking mode. Also, the second control unit 202 outputs the second control signal Sc2 to control the second fan unit 206 entering a braking mode. Accordingly, the return air is prevent from blowing to the first fan unit 106 and the second fan unit 206 to reverse the rotation of the first fan blade 106B and the second fan blade 206B to therefore damage the fan failure backup apparatus 100 under the failure of the first fan module 10 and the second fan module 20.

More specifically, when the first control unit 102 realizes that the first fan module 10 is failed through the feedback signal (not shown) and the second control unit 202 realizes that the second fan module 20 is failed through the feedback signal (not shown), the first control unit 102 outputs the first warning signal Sw1 to the second control unit 202 and the second control unit 202 also outputs the second warning signal Sw2 to the first control unit 102. At this condition, the first control unit 102 outputs the first control signal Sc1 to turn on the upper-bridge switch assembly 104A or the lower-bridge switch assembly 104B of the first drive unit 104 so as to lock the first motor 106A and enter the braking mode. Also, the second control unit 202 outputs the second control signal Sc2 to turn on the upper-bridge switch assembly 204A or the lower-bridge switch assembly 204B of the second drive unit 204 so as to lock the second motor 206A and enter the braking mode.

When the first control unit 102 realizes that the first fan module 10 is failed and the second fan module 20 is not failed (in normal operation), the return air is prevented from blowing to the first fan unit 106 to reverse the rotation of the first fan blade 106B to therefore damage the fan failure backup apparatus 100 under the failure of the first fan module 10. More specifically, when the first control unit 102 realizes that the first fan module 10 is failed through the feedback signal (not shown) and outputs the first warning signal Sw1 to the second control unit 202, and the first control unit 102 realizes that the second fan module 20 is not failed (in normal operation) and does not output the second warning signal Sw2 to the first control unit 102, the first control unit 102 outputs the first control signal Sc1 to turn on the upper-bridge switch assembly 104A or the lower-bridge switch assembly 104B of the first drive unit 104 so as to lock the first motor 106A and (only the first fan unit 106) enter the braking mode.

In one embodiment, the first fan unit 106 and the second fan unit 206 of the fan failure backup apparatus 100 are, for example but not limited to, three-phase AC fans. In other words, three-phase or single-phase AC or DC fans may be applied in the fan failure backup apparatus 100.

Figure 2A:
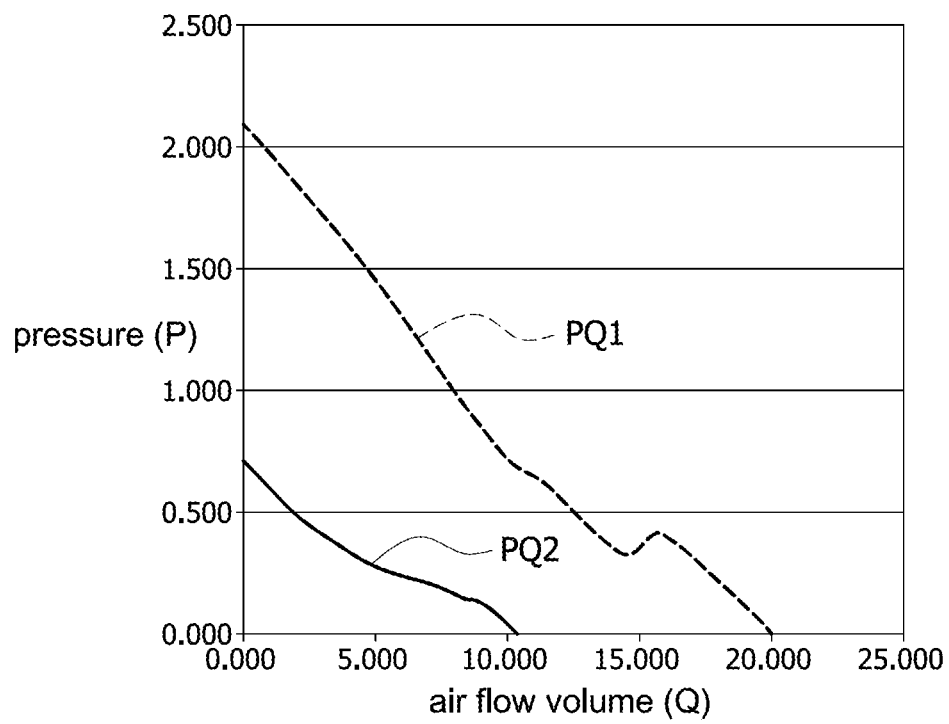
FIG. 2A shows pressure-flow characteristic curves when the fan failure backup apparatus is not activated according to the present disclosure.

Please refer to FIG. 2A, which shows pressure-flow characteristic curves when the fan failure backup apparatus is not activated according to the present disclosure, and also refer to FIG. 1. When the backup mechanism of the fan failure backup apparatus 100 is not activated, the pressure-flow characteristic curve of the first fan unit 106, namely a first pressure-flow characteristic curve PQ1 is expressed in the dotted line, and the pressure-flow characteristic curve of the second fan unit 206, namely a second pressure-flow characteristic curve PQ2 is expressed in the solid line. At this condition, the first fan module 10 controls the first fan unit 106 under a predetermined rotation speed to provide the first pressure-flow characteristic curve PQ1, and the second fan module 20 controls the second fan unit 206 under a predetermined rotation speed to provide the second pressure-flow characteristic curve PQ2. In one embodiment, since the first fan unit 106 is the front fan and the second fan unit 206 is the rear fan, the first pressure-flow characteristic curve PQ1 is above the second pressure-flow characteristic curve PQ2.

Figure 2B:
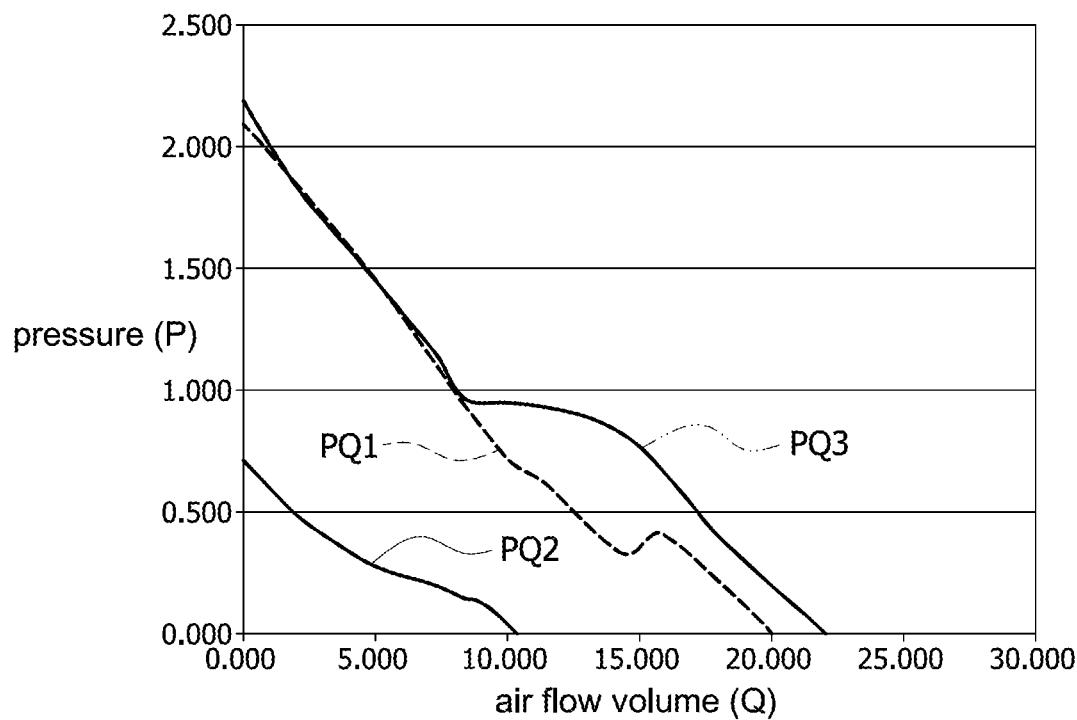
FIG. 2B shows pressure-flow characteristic curves when the fan failure backup apparatus is activated according to the present disclosure.

Please refer to FIG. 2B, which shows pressure-flow characteristic curves when the fan failure backup apparatus is activated according to the present disclosure, and also refer to FIGS. 1 to 2A. When the first fan module 10 is failed but the second fan module 20 is not failed, the second control unit 202 realizes that the first fan module 10 is failed according the received first warning signal Sw1. At this condition, the second control unit 202 enhances the pressure-flow characteristic of the second fan unit 206 by increasing the rotation speed of the second fan unit 206. Therefore, the enhanced pressure-flow characteristic is greater than or equal to the original (non-enhanced) pressure-flow characteristic, namely the pressure-flow characteristic of the first pressure-flow characteristic curve PQ1 so that the second fan module 20 compensates the reduced pressure-flow characteristic of the first fan module 10 due to the failure of the first fan module 10. As shown in FIG. 2B, when the second control unit 202 realizes that the first fan module 10 is failed according the received first warning signal Sw1, the second control unit 202 enhances the second pressure-flow characteristic curve PQ2 to the third pressure-flow characteristic curve PQ3 (expressed in the thick solid line) by increasing the rotation speed of the second fan unit 206. The third pressure-flow characteristic of the third pressure-flow characteristic curve PQ3 is greater than or equal to that of the first pressure-flow characteristic curve PQ1, and therefore the second fan module 20 compensates the reduced pressure-flow characteristic of the first fan module 10 due to the failure of the first fan module 10.

Figure 3:
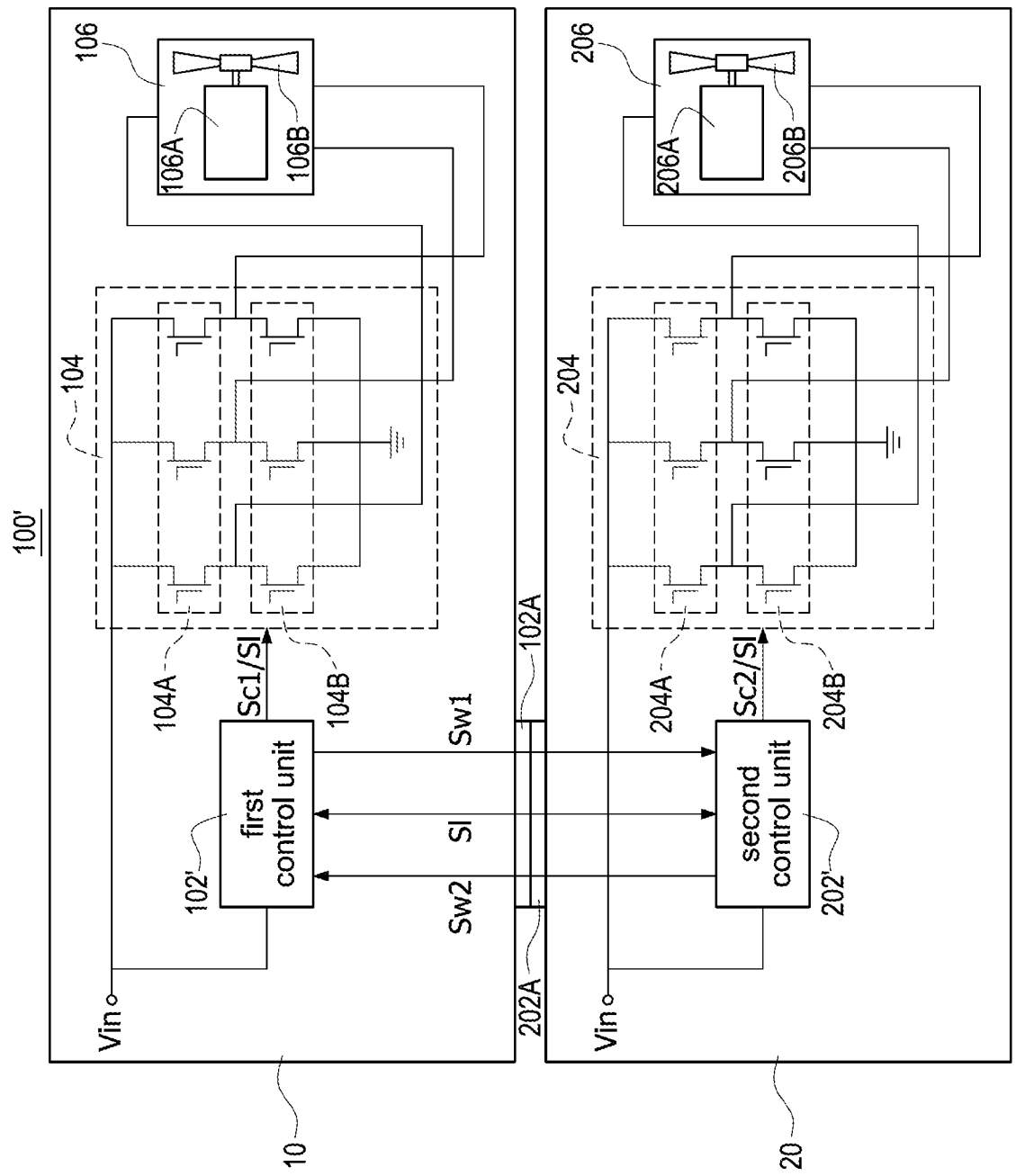
FIG. 3 is a circuit block diagram of the fan failure backup apparatus according to a second embodiment of the present disclosure.

Please refer to FIG. 3, which shows a circuit block diagram of the fan failure backup apparatus according to a second embodiment of the present disclosure, and also refer to FIGS. 1 to 2B. The major difference between the second embodiment and the first embodiment shown in FIG. 1 is that a first control unit 102' and a second control unit 202' of the fan failure backup apparatus 100' may mutually control the first drive unit 104 and a second drive unit 204. In general, the failure of the first control unit 102' may cause the failure of the first fan module 10, and similarly the failure of the second control unit 202' may cause the failure of the second fan module 20. In one embodiment, take the first control unit 102' is failed for example. When the first control unit 102' is failed (to cause the failure of the first fan module 10) but the second fan module 20 is not failed (in normal operation), the first control unit 102' fails to output the first control signal Sc1 to lock the first motor 106A by turning on the upper-bridge switch assembly 104A or the lower-bridge switch assembly 104B of the first drive unit 104. At this condition, when the second control unit 202' realizes the first fan module 10 is failed by the first warning signal Sw1 outputted from the first control unit 102', the second control unit 202' outputs a lock signal S1 to lock the first motor 106A through the first control unit 102'. More specifically, the lock signal S1 outputted from the second control unit 202' is transmitted to the first control unit 102', and the first control unit 102' provides the lock signal S1 to the first drive unit 104 to turn on the upper-bridge switch assembly 104A or the lower-bridge switch assembly 104B of the first drive unit 104. Since a backup method performed by the second control unit 202' is similar to that performed by the first control unit 102', the detail description of the former is omitted here for conciseness.

Figure 4A:
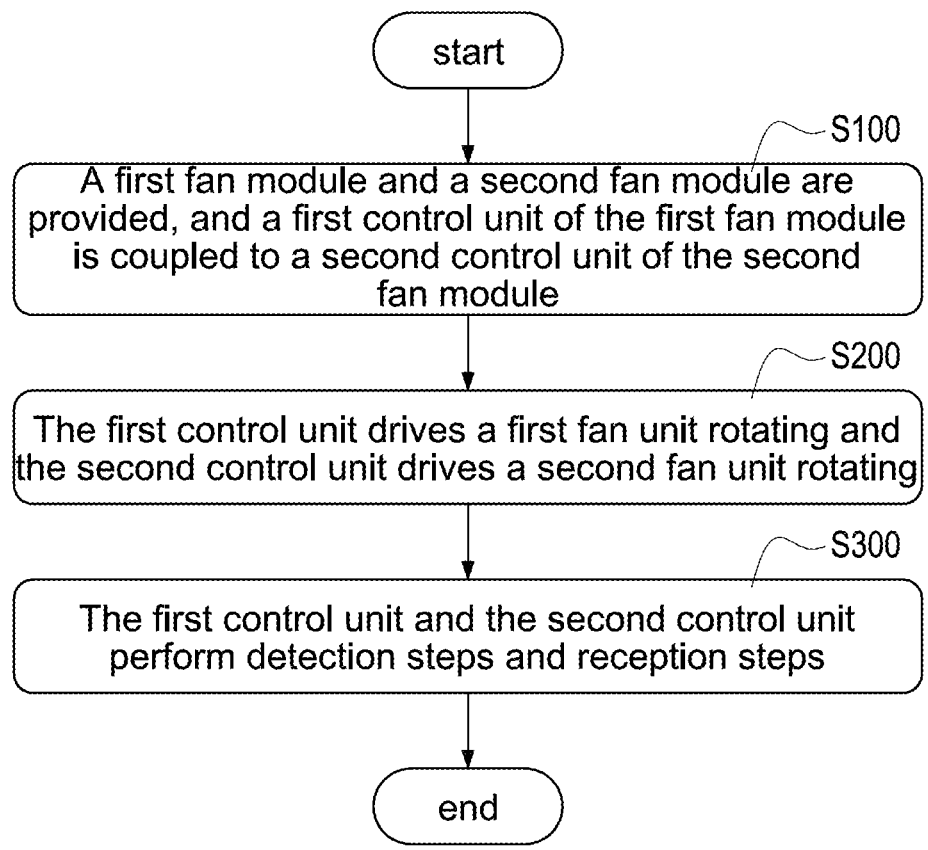
FIG. 4A is a flowchart of a method of backing up the fan failure backup apparatus according to the present disclosure.

Please refer to FIG. 4A, which shows a flowchart of a method of backing up the fan failure backup apparatus according to the present disclosure, and also refer to FIGS. 1 to 3. The backup method is applied to the fan failure backup apparatus 100, and the backup method includes steps as follows. First, a first fan module 10 and a second fan module 20 are provided, and a first control unit 102 of the first fan module 10 is coupled to a second control unit 202 of the second fan module 20 (S100). The fan failure backup apparatus 100 includes the first fan module 10 and the second fan module 20, and the first fan module 10 includes the first control unit 102 and the second fan module 20 includes the second control unit 202. The first control unit 102 has a first connecting terminal 102A and the second control unit 202 has a second connecting terminal 202A. By coupling between the first connecting terminal 102A and the second connecting terminal 202A coupled to the first connecting terminal 102A. The first control unit 102 is communicated with the second control unit 202 to realize each other's operation state by the first connecting terminal 102A and the second connecting terminal 202A.

Afterward, the first control unit 102 drives the first fan unit 106 rotating and the second control unit 202 drives the second fan unit 206 rotating (S200). The first control unit 102 outputs a first control signal Sc1 to a first drive unit 104 to drive the first fan unit 106 rotating. The second control unit 202 outputs a second control signal Sc2 to a second drive unit 204 to drive the second fan unit 206 rotating.

Afterward, the first control unit 102 and the second control unit 202 perform detecting steps and receiving steps (S300). In the detecting steps, the first control unit 102 detects whether the first fan module 10 is failed and the second control unit 202 detects whether the second fan module 20 is failed. In the receiving steps, the first control unit 102 determines whether the first control unit 102 outputs a first warning signal Sw1 and receives a second warning signal Sw2, and the second control unit 202 determines whether the second control unit 202 outputs the second warning signal Sw2 and receives the first warning signal Sw1. In accordance with the detecting steps and receiving steps, the fan failure backup apparatus 100 may quickly realize operation states of the first fan module 10 and the second fan module 20, thereby providing the real-time backup function once the failure of the fan module occurs.

Figure 4B:
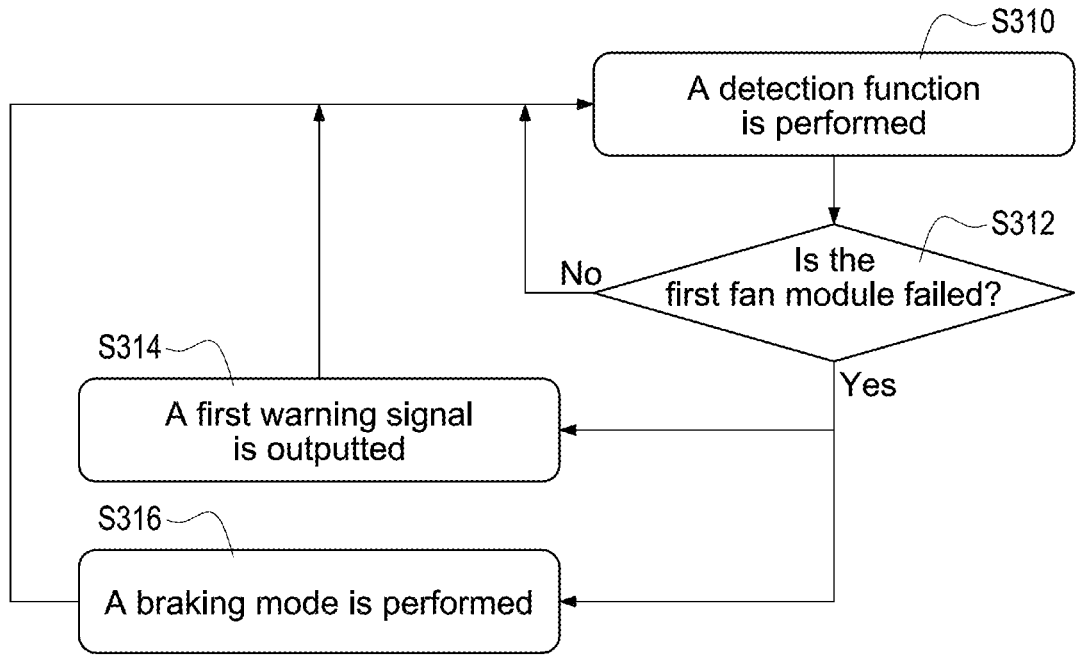
FIG. 4B is a flowchart of detecting steps in the method according to the present disclosure.

Please refer to FIG. 4B, which shows a flowchart of detecting steps in the method according to the present disclosure, and also refer to FIGS. 1 to 4A. In one embodiment, it is assumed that the first fan module 10 is failed for example, and the detecting steps are as follow. First, a detecting function is performed (S310). Afterward, the first control unit 102 outputs the first control signal Sc1 to the first drive unit 104 and continuously detects whether the first fan module 10 is failed according to a feedback signal (S312). When the first control unit 102 determines that the first fan module 10 is not failed, and then the steps (S310) and (S320) are performed again to continuously detect whether the first fan module 10 is failed or not. Afterward, the first control unit 102 outputs the first warning signal Sw1 when determining that the first fan module 10 is failed (S314). More specifically, when the first control unit 102 determines that the first fan module 10 is failed, the first control unit 102 outputs the first warning signal Sw1 to the second control unit 202, thereby making the second control unit 202 realize that the first fan module 10 is failed, and then the steps (S310) and (S320) are performed again. When the first control unit 102 determines that the first fan module 10 is failed, a braking mode is performed (S316). More specifically, when the first control unit 102 determines that the first fan module 10 is failed, the first control unit 102 outputs the first control signal Sc1 to turn on the upper-bridge switch assembly 104A or the lower-bridge switch assembly 104B of the first drive unit 104 so as to lock the first motor 106A and enter the braking mode, and then the steps (S310) and (S320) are performed again. Since the detecting steps for the failure of the second fan module 20 is similar to those for the failure of the first fan module 10, the detail description of the former is omitted here for conciseness.

Figure 4C:
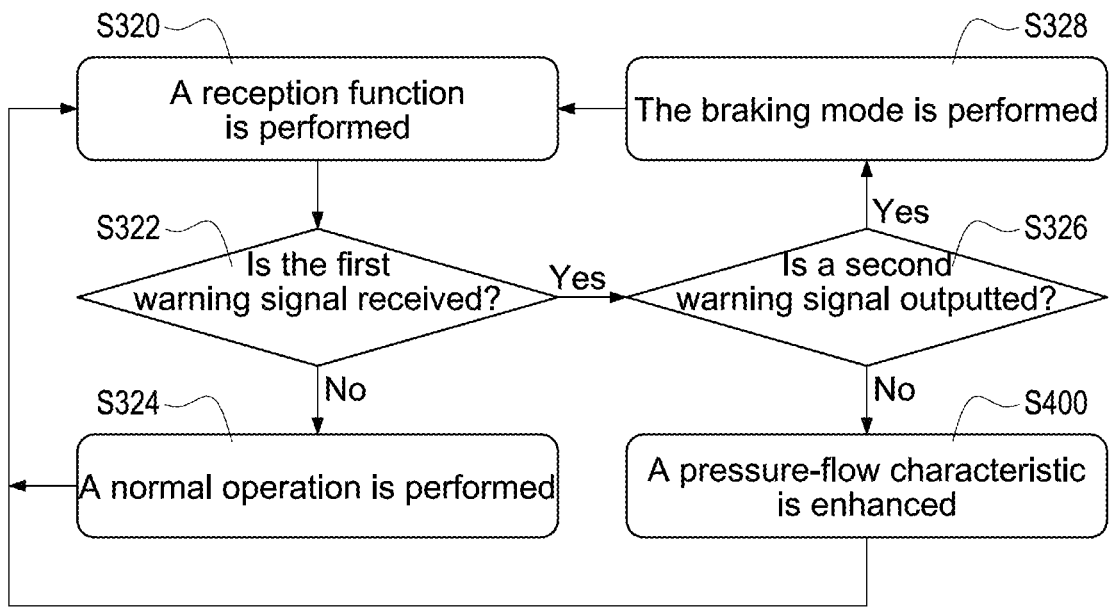
FIG. 4C is a flowchart of receiving steps in the method according to the present disclosure.

Please refer to FIG. 4C, which shows a flowchart of receiving steps in the method according to the present disclosure, and also refer to FIGS. 1 to 4B. In one embodiment, it is assumed that the second control unit 202 performs the receiving steps under the failure of the first fan module 10 for example, and the receiving steps are as follow. First, a receiving function is performed (S320). Therefore, the first control unit 102 is communicated with the second control unit 202 to realize the operation states of the fan units controlled by the first control unit 102 and the second control unit 202 through the first connecting terminal 102A and the second connecting terminal 202A. Afterward, the second control unit 202 determines whether the first warning signal Sw1 is received or not (S322), and the second control unit 202 continuously detects whether the first fan module 10 is failed by continuously detecting whether the first warning signal Sw1 is received or not. Afterward, a normal operation is performed (S324). When the second control unit 202 does not receive the first warning signal Sw1, the second control unit 202 controls the second fan module 20 normally operating to make the second fan unit 206 being in normal operation, and then the steps (S320) and (S322) are performed again. When the second control unit 202 receives the first warning signal Sw1, the second control unit 202 determines whether the second fan module 20 is also failed. Afterward, the second control unit 202 determines whether the second warning signal Sw2 is outputted or not (S326). When the second control unit 202 realizes that the first fan module 10 is failed, the second control unit 202 determines whether the second control unit 202 also outputs the second warning signal Sw2 to the first control unit 102. Afterward, a braking mode is performed (S328). When the second control unit 202 receives the first warning signal Sw1 and outputs the second warning signal Sw2, it means that the first fan module 10 and the second fan module 20 are both failed. At this condition, the first control unit 102 controls the first fan unit 106 entering the braking mode, and the second control unit 202 controls the second fan unit 206 entering the braking mode, and then the steps (S320) and (S322) are performed again.

More specifically, when the first fan module 10 and the second fan module 20 are both failed, the first control unit 102 outputs the first control signal Sc1 to turn on the upper-bridge switch assembly 104A or the lower-bridge switch assembly 104B of the first drive unit 104 so as to lock the first motor 106A and make the first fan unit 106 enter the braking mode. Simultaneously, the second control unit 202 outputs the second control signal Sc2 to turn on the upper-bridge switch assembly 204A or the lower-bridge switch assembly 204B of the second drive unit 204 so as to lock the second motor 206A and make the second fan unit 206 enter the braking mode.

Finally, a pressure-flow characteristic of the fan unit is enhanced (S400). In the step (S326), when the second control unit 202 realizes that the first fan module 10 is failed by the first control unit 102 and determines the second warning signal Sw2 is not outputted to the first control unit 102, the second control unit 202 controls the second fan module 20 to additionally enhance the pressure-flow characteristic of the second fan unit 206, and then the steps S320 and S322 are performed again. Since the receiving steps performed by the first control unit 102 for the failure of the second fan module 20 is similar to those performed by the second control unit 202 for the failure of the first fan module 10, the detail description of the former is omitted here for conciseness.

Figure 4D:
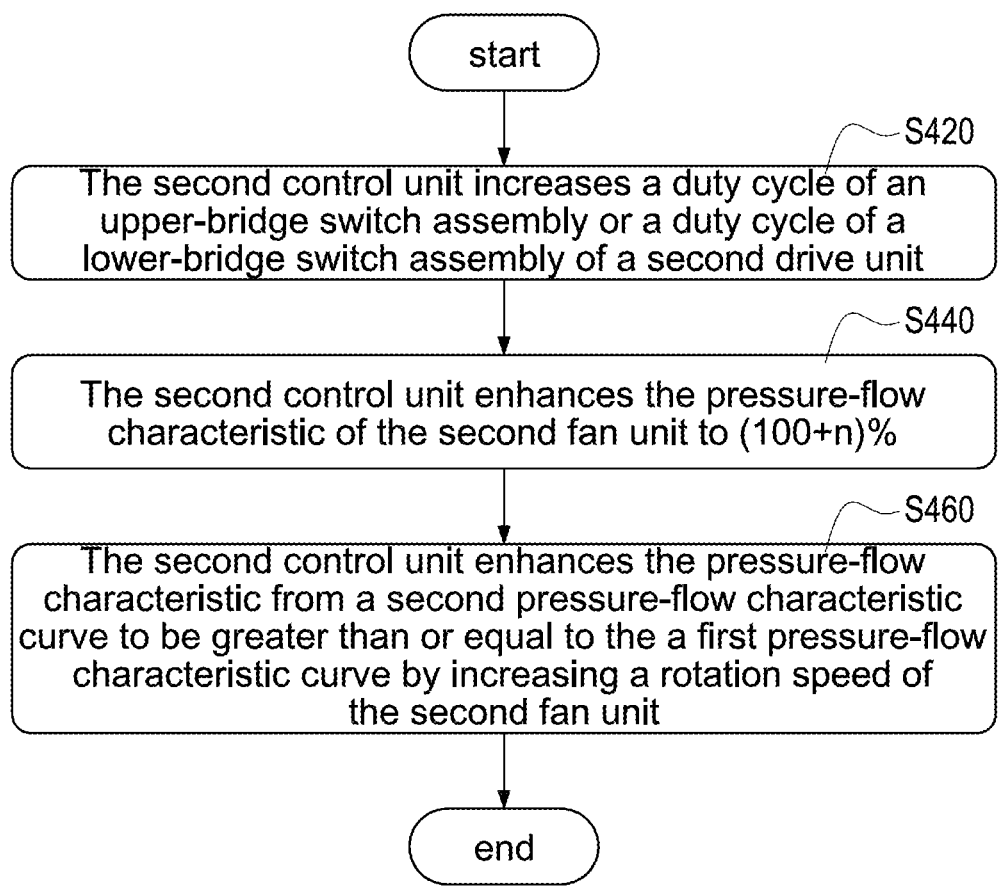
FIG. 4D is a flowchart of enhancing pressure-flow characteristic in the method according to the present disclosure.

Please refer to FIG. 4D, which shows a flowchart of enhancing pressure-flow characteristic in the method according to the present disclosure, and also refer to FIGS. 1 to 4C. In one embodiment, it is assumed that the first fan module 10 is failed and the second control unit 202 additionally enhances the pressure-flow characteristic of the second fan unit 206. The step S400 further includes steps S420 to S460. First, the second control unit 202 increases a duty cycle of the upper-bridge switch assembly 204A of the second drive unit 204 or a duty cycle of the lower-bridge switch assembly 204B of the second drive unit 204 (S420). The second control unit 202 adjust the second control signal Sc2 outputted to the second drive unit 204 so as to increase the duty cycle of the upper-bridge switch assembly 204A or the duty cycle of the lower-bridge switch assembly 204B, thereby increasing the rotation speed of the second fan unit 206. Afterward, the second control unit 202 enhances the pressure-flow characteristic of the second fan unit 206 to (100+n) % (S440), in which n is less than or equal to 99. When the rotation speed of the second fan unit 206 is increased, and also the pressure-flow characteristic of the second fan unit 206 is enhanced. The second control unit 202 enhances the pressure-flow characteristic of the second fan unit 206 to (100+n) % so that the pressure-flow characteristic of the fan failure backup apparatus 100 is maintained, that is the second fan module 20 compensates the reduced pressure-flow characteristic of the first fan module 10 due to the failure of the first fan module 10. Finally, the second control unit 202 enhances the pressure-flow characteristic from a second pressure-flow characteristic curve PQ2 of the second fan unit 206 to be greater than or equal to the a first pressure-flow characteristic curve PQ1 by increasing the rotation speed of the second fan unit 206 (S460). When the second control unit 202 realizes that the first fan module 10 is failed by receiving the first warning signal Sw1, the second control unit 202 enhances the pressure-flow characteristic of the second fan unit 206 from the second pressure-flow characteristic curve PQ2 to a third pressure-flow characteristic curve PQ3 by increasing the rotation speed of the second fan unit 206. The third pressure-flow characteristic of the third pressure-flow characteristic curve PQ3 is greater than or equal to that of the first pressure-flow characteristic curve PQ1, and therefore the second fan module 20 compensates the reduced pressure-flow characteristic of the first fan module 10 due to the failure of the first fan module 10. Since the pressure-flow characteristic of the first fan unit 106 enhanced by the first control unit 102 for the failure of the second fan module 20 is similar to that of the second fan unit 206 enhanced by the second control unit 202 for the failure of the first fan module 10, the detail description of the former is omitted here for conciseness.

In conclusion, the present disclosure has following features and advantages:

1. Since the first control unit is integrated inside the first fan module and the second control unit is integrated inside the second fan module, no additional control units or controllers need to be used to control the first fan module and the second fan module for failure backup, thereby simplifying the hardware architecture.

2. By coupling between the first connecting terminal and the second connecting terminal, the first control unit is communicated with the second control unit to realize each other's operation state, thereby simplifying wires externally connected to the first control unit and the second control unit.

3. Since the pressure-flow characteristic is limited to enhance to (100+n) %, the significant increased rotation speed of the fan unit of the fan module which is not failed would not damage the corresponding drive unit due to the generated large current.

4. When the braking mode is performed, the return air is prevent from blowing to the first fan unit and the second fan unit to reverse the rotation of the first fan blade and that of the second fan blade to therefore damage the fan failure backup apparatus under the failure of the first fan module.

5. When the first fan module or the second fan module is failed, the pressure-flow characteristic of the first fan unit or that of the second fan unit is enhanced so to additionally compensate the reduced pressure-flow characteristic of the first fan module or that of the second fan module.

6. When one of the first control unit and the second control unit is failed, the other non-failed control unit can still control the fan module corresponding to the failed control unit entering the braking mode to achieve the backup function under the failure of the fan module.

7. The detecting steps and the receiving steps are performed for the fan failure backup apparatus to quickly realize that the operation state of the first fan module and that of the second fan module, thereby achieving the real-time backup function once the failure of the fan module occurs.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A fan failure backup apparatus comprising:
   a first fan module comprising:
     a first fan unit, and
     a first control unit coupled to the first fan unit and the first control unit including a first connecting terminal; and
   a second fan module comprising:
     a second fan unit, and
     a second control unit coupled to the second fan unit and the second control unit including a second connecting terminal;
   wherein the second control unit is coupled to the first connecting terminal through the second connecting terminal to communicate with the first control unit, so that the first control unit and the second control unit realize operation states of the first fan unit and the second fan unit; a series axial-flow fan comprises the first fan module and the second fan module, the first fan module is a front fan and the second fan module is a rear fan; the first control unit independently controls a pressure-flow characteristic of the first fan unit to be a first pressure-flow characteristic curve, the second control unit independently controls the pressure-flow characteristic of the second fan unit to be a second pressure-flow characteristic curve, and the second pressure-flow characteristic curve is smaller than the first pressure-flow characteristic curve; when the second control unit is configured to realize that the first fan module is failed through the first control unit and realize that the second fan module is not failed, the second control unit is configured to control the second fan module to additionally enhance the second pressure-flow characteristic curve to be greater than or equal to the first pressure-flow characteristic curve.

2. The fan failure backup apparatus in claim 1, wherein the pressure-flow characteristic of the second fan unit is enhanced to (100+n) %, in which n is less than or equal to 99.

3. The fan failure backup apparatus in claim 1, wherein when the first fan module fails, the first control unit is configured to control the first fan unit entering a braking mode.

4. The fan failure backup apparatus in claim 1, wherein the first control unit is configured to output a first warning signal to the second control unit so that the second control unit is configured to realize that the first fan module is failed.

5. The fan failure backup apparatus in claim 4, wherein when the first fan module and the second fan module are failed, the second control unit is configured to receive the first warning signal and output a second warning signal to the first control unit; the first control unit is configured to control the first fan unit entering a braking mode, and the second control unit is configured to control the second fan unit entering the braking mode.

6. The fan failure backup apparatus in claim 5, wherein the first fan module further comprises:
a first drive unit coupled to the first control unit and the first fan unit;
the second fan module further comprises:
a second drive unit coupled to the second control unit and the second fan unit;
wherein the first control unit is configured to control an upper-bridge switch assembly of the first drive unit being turned on or a lower-bridge switch assembly of the first drive unit being turned on to control the first fan unit entering the braking mode; the second control unit is configured to control an upper-bridge switch assembly of the second drive unit being turned on or a lower-bridge switch assembly of the second drive unit being turned on to control the second fan unit entering the braking mode.

7. The fan failure backup apparatus in claim 6, wherein the second control unit is configured to increase a duty cycle of the upper-bridge switch assembly of the second drive unit or a duty cycle of the lower-bridge switch assembly of the second drive unit to additionally enhance the pressure-flow characteristic of the second fan unit.

8. A method of backing up a fan failure backup apparatus, the method comprising steps of:
(a) providing a first fan module and a second fan module; wherein a series axial-flow fan comprises the first fan module and the second fan module, and the first fan module is a front fan and the second fan module is a rear fan; a first control unit of the first fan module is coupled to a second control unit of the second fan module to communicate with each other so that the first control unit and the second control unit realize operation states of the first fan unit and the second fan unit;
(b) driving a first fan unit of the first fan module to rotate by the first control unit, and driving a second fan unit of the second fan module to rotate by the second control unit; the first control unit independently controls a pressure-flow characteristic of the first fan unit to be a first pressure-flow characteristic curve, the second control unit independently controls the pressure-flow characteristic of the second fan unit to be a second pressure-flow characteristic curve, and the second pressure-flow characteristic curve is smaller than the first pressure-flow characteristic curve;
(c) continuously detecting whether the first fan module fails by the second control unit, and continuously detecting whether the second fan module fails by the first control unit; and
(d) controlling the second fan module to additionally enhance the second pressure-flow characteristic curve to be greater than or equal to the first pressure-flow characteristic curve by the second control unit when the second control unit is configured to realize that the first fan module is failed through the first control unit and realize that the second fan module is not failed.

9. The method of backing up the fan failure backup apparatus in claim 8, wherein the step (d) further comprises a step of:
(d1) enhancing the pressure-flow characteristic of the second fan unit to (100+n) %, in which n is less than or equal to 99.

10. The method of backing up the fan failure backup apparatus in claim 8, wherein the step (d) further comprises a step of:
(d3) controlling the first fan unit entering a braking mode by the first control unit when the first control unit is configured to realize that the first fan module is failed.

11. The method of backing up the fan failure backup apparatus in claim 8, further comprising a step of:
(e) receiving a first warning signal outputted from the first control unit and outputting a second warning signal to the first control unit by the second control unit when the first fan module and the second fan module are failed; controlling the first fan unit entering a braking mode by the first control unit and controlling the second fan unit entering the braking mode by the second control unit.

12. The method of backing up the fan failure backup apparatus in claim 11, wherein the step (e) further comprises a step of:
(e1) turning on an upper-bridge switch assembly or a lower-bridge switch assembly of a first drive unit of the first fan module to control the first fan unit entering the braking mode by the first control unit; turning on an upper-bridge switch assembly or a lower-bridge switch assembly of a second drive unit of the second fan module to control the second fan unit entering the braking mode by the second control unit.

13. The method of backing up the fan failure backup apparatus in claim 12, wherein the step (d) further comprises a step of:
(d4) increasing a duty cycle of the upper-bridge switch assembly of the second drive unit or a duty cycle of the lower-bridge switch assembly of the second drive unit by the second control unit to additionally enhance the pressure-flow characteristic of the second fan unit.

* * * * *